United States Patent
Lee et al.

(10) Patent No.: US 9,232,572 B2
(45) Date of Patent: Jan. 5, 2016

(54) ORGANIC LIGHT-EMITTING DISPLAY DEVICE AND METHOD OF MANUFACTURING THE SAME

(71) Applicant: Samsung Display Co., Ltd., Yongin, Gyeonggi-do (KR)

(72) Inventors: Jae-Sun Lee, Yongin (KR); Su-Hyuk Choi, Yongin (KR); Ung-Soo Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/012,975

(22) Filed: Aug. 28, 2013

(65) Prior Publication Data

US 2014/0319997 A1    Oct. 30, 2014

(30) Foreign Application Priority Data

Apr. 26, 2013   (KR) .................. 10-2013-0046928

(51) Int. Cl.
| | | |
|---|---|---|
| *H05B 33/04* | (2006.01) | |
| *H01L 51/52* | (2006.01) | |
| *H05B 33/10* | (2006.01) | |

(52) U.S. Cl.
CPC ............ *H05B 33/04* (2013.01); *H01L 51/5253* (2013.01); *H05B 33/10* (2013.01)

(58) Field of Classification Search
CPC ..... H05B 33/04; H05B 33/10; H01L 51/5253
See application file for complete search history.

(56) References Cited

U.S. PATENT DOCUMENTS

| | | | |
|---|---|---|---|
| 7,722,929 B2 | 5/2010 | Aitken et al. | |
| 7,749,811 B2 | 7/2010 | Aitken et al. | |
| 8,435,604 B2 | 5/2013 | Aitken et al. | |
| 2007/0040501 A1 | 2/2007 | Aitken et al. | |
| 2008/0290798 A1 | 11/2008 | Quesada | |
| 2014/0091292 A1* | 4/2014 | Baker et al. ................ | 257/40 |

FOREIGN PATENT DOCUMENTS

| | | |
|---|---|---|
| EP | 1 278 244 A2 | 1/2003 |
| JP | 2005-298703 | 10/2005 |
| KR | 10-2006-0059730 A | 6/2006 |
| KR | 10-2008-0018817 | 2/2008 |
| KR | 10-2010-0035320 | 4/2010 |
| KR | 10-2010-0050470 | 5/2010 |

OTHER PUBLICATIONS

KIPO Registration Determination Certificate dated Jun. 18, 2014, for Korean priority Patent application 10-2013-0046928, (2 pages).
EPO Search Report dated Jan. 22, 2015, for corresponding European Patent application 14155647.2, (6 pages).

\* cited by examiner

*Primary Examiner* — Anne Hines
(74) *Attorney, Agent, or Firm* — Christie, Parker & Hale, LLP

(57) ABSTRACT

An organic light-emitting display device includes: a substrate; an organic light-emitting unit that is formed on the substrate and comprises a first electrode, an intermediate layer, and a second electrode; an organic film formed on the organic light-emitting unit; a first elastic layer that is formed on the organic film and comprises an elastomer; and a first inorganic film that is formed on the first elastic layer and comprises a low temperature viscosity transition (LVT) inorganic material.

10 Claims, 3 Drawing Sheets

ORGANIC LIGHT-EMITTING DISPLAY DEVICE AND METHOD OF MANUFACTURING THE SAME

CROSS-REFERENCE TO RELATED APPLICATION

This application claims priority to and the benefit of Korean Patent Application No. 10-2013-0046928, filed on Apr. 26, 2013, in the Korean Intellectual Property Office, the disclosure of which is incorporated herein in its entirety by reference.

BACKGROUND

1. Field

The following description relates to an organic light-emitting display device and a method of manufacturing the same.

2. Description of the Related Art

Organic light-emitting display devices are emissive display devices and have characteristics of a large viewing angle, high contrast, rapid response time, high brightness, suitable driving voltage, and fast response speed, and may display a multi-color image.

An organic light-emitting display device includes an organic light-emitting unit that includes a lower electrode, an organic layer, and an upper electrode. The organic light-emitting unit is very weak to external agents, for example, oxygen or moisture, and thus, a structure that seals the organic light-emitting unit from the external agents is needed.

Also, there is a desire to develop a thin organic light-emitting display device and/or a flexible organic light-emitting display device.

SUMMARY

Aspects of embodiments of the present invention are directed toward an organic light-emitting display device having a strong and thin encapsulation structure, and a method of manufacturing the same.

According to an embodiment of the present embodiment, an organic light-emitting display device includes: a substrate; an organic light-emitting unit that is formed on the substrate and includes a first electrode, an intermediate layer, and a second electrode; an organic film formed on the organic light-emitting unit; a first elastic layer that is formed on the organic film and includes an elastomer; and a first inorganic film that is formed on the first elastic layer and includes a low temperature viscosity transition (LVT) inorganic material.

The elastomer may be a transparent elastomer.

The elastomer may include at least one of poly dimethyl siloxane (PDMS), polysilicon, transparent poly-urethane, and styrene block copolymer (SBC).

The LVT inorganic material may include a tin oxide.

The first elastic layer and the first inorganic film may be formed on the substrate.

The organic light-emitting display device may further include an adhesion promoting layer between the first elastic layer and the first inorganic film.

The adhesion promoting layer may include at least one of a metal oxide and an organometallic compound.

The organic light-emitting display device may further include: a second elastic layer that is formed on the first inorganic film and includes the elastomer; and a second inorganic film that is formed on the second elastic layer and includes the LVT inorganic material.

The organic light-emitting display device may further include an encapsulation substrate formed on the second inorganic film.

According to an embodiment of the present invention, a method of manufacturing an organic light-emitting display device includes: forming an organic light-emitting unit that includes a first electrode, an intermediate layer, and a second electrode on a substrate; forming an organic film on the organic light-emitting unit; forming a first elastic layer that includes an elastomer on the organic film; and forming a first inorganic film that includes an LVT inorganic material on the first elastic layer.

The elastomer may include at least one of PDMS, polysilicon, transparent poly-urethane, and SBC.

The forming of the first inorganic film may include: forming a first pre-inorganic layer that includes the LVT inorganic material by providing the LVT inorganic material on the first elastic layer; and healing the first pre-inorganic layer at a temperature greater than a temperature changing in viscosity of the LVT inorganic material.

The first elastic layer and the first inorganic film may be formed on the substrate.

The method may further include forming an adhesion promoting layer that includes at least one of a metal oxide and an organometallic compound between the first elastic layer and the first inorganic film.

The method may further include: forming a second elastic layer that includes an elastomer on the first inorganic film; and forming a second inorganic film that includes the LVT inorganic material on the second elastic layer.

According to the embodiments of the present embodiment, an elastic layer is formed between an organic film and an inorganic film to reduce stress between the organic film and the inorganic film, and thus, a strong thin encapsulation structure for an organic light-emitting display device is realized.

Also, according to the embodiments of the present invention, a thin film encapsulation structure has a good encapsulation characteristic with respect to external agents, and thus, the organic light-emitting display device including the thin film encapsulation structure has a long lifespan.

BRIEF DESCRIPTION OF THE DRAWINGS

The above and other features and enhancements of the present embodiments will become more apparent by describing in more detail example embodiments thereof with reference to the attached drawings in which.

DETAILED DESCRIPTION

Figure 1:
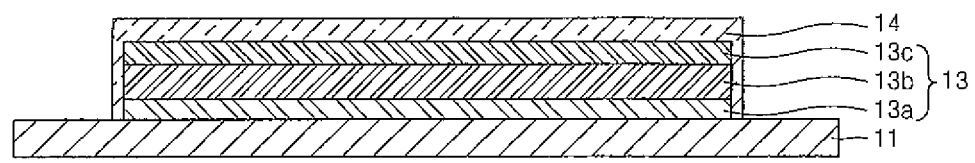
FIGS. 1 through 3 are schematic cross-sectional views sequentially illustrating a method of manufacturing an organic light-emitting display device according to an embodiment.

The configurations and operations according to embodiments will be described more fully with reference to the accompanying drawings, in which example embodiments are shown.

In the current specification, parts that are not related to the embodiments are omitted in the drawings and are not described or just briefly shown in the drawings and briefly described. Also, in the drawings, the lengths and sizes of layers and regions may be exaggerated for clarity.

Like reference numerals are used for elements that are substantially identical or correspond to each other throughout the description of the figures. The terms 'first', 'second', etc. in the current specification may be used to describe various elements, and these elements should not be limited by these terms but are only used to distinguish one element from another. Also, it will be understood that when a layer, a region, or an element is referred to as being "formed on" another element or layer, it may include a case when the layer, the region, or the element is directly formed on the other layer, region, or element, and it may also include a case when the layer, the region, or the element is formed on the other layer, region, or element with the presence of an intervening layer(s), region(s), or element(s). Further, the use of "may" when describing embodiments of the present invention refers to "one or more embodiments of the present invention."

Figure 2:
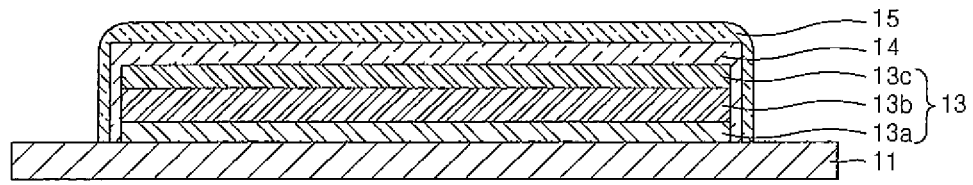
Figure 3:
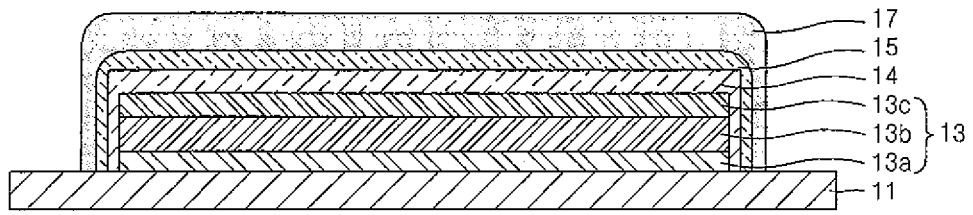

FIGS. 1 through 3 are schematic cross-sectional views sequentially illustrating a method of manufacturing an organic light-emitting display device according to an embodiment.

First, a substrate 11 is prepared. The substrate 11 may be a substrate generally used in an organic light-emitting display device. The substrate 11 may be formed of a material having characteristics such as high mechanical strength, thermal stability, surface planarity, ease of handling, and waterproofness.

The substrate 11 may be formed of a rigid material. The substrate 11 may be, for example, a glass substrate, a plastic substrate, a metal substrate, or a carbon fiber substrate. When the organic light-emitting display device is a flexible display device, the substrate 11 may be formed of a flexible material. In this case, the substrate 11 may be one of a polyimide (PI) substrate and a polyethylene terephthalate (PET) substrate.

An organic light-emitting unit 13 is formed on the substrate 11. The organic light-emitting unit 13 may have a structure in which a first electrode 13a, an intermediate layer 13b, and a second electrode 13c are sequentially formed on the substrate 11.

The first electrode 13a may be formed by providing a first electrode material on the substrate 11 by using a deposition method or a sputtering method. When the first electrode 13a is an anode electrode, a lower electrode material may be selected from materials having a high work function so that holes are readily injected onto the first electrode 13. According to the organic light-emitting display device, the first electrode 13a may be a reflective electrode, a semi-transparent electrode, or a transmissive electrode. The first electrode material may be a highly transparent conductive material selected from indium tin oxide (ITO), indium zinc oxide (IZO), tin oxide (($SnO_2$), and zinc oxide (ZnO). When the first electrode 13a is formed of a material selected from Mg, Al, Al—Li, Ca, Mg—In, and Mg—Ag, the first electrode 13a may be formed as a reflective electrode.

The first electrode 13a may have a single layer or a multi-layer structure having more than two layers. For example, the first electrode 13a may have a three layer structure of ITO/Ag/ITO in order to form a top emission device, but the present embodiment is not limited thereto.

The intermediate layer 13b is formed on the first electrode 13a.

The intermediate layer 13b may include at least one layer selected from a hole injection layer, a hole transport layer, a functional layer simultaneously having a hole injection function and a hole transport function, a buffer layer, an electrode blocking layer, a light-emitting layer, a hole blocking layer, an electron transport layer, and an electron injection layer.

The intermediate layer 13b may include at least one compound, for example, one selected from compounds 301, 311, and 321 shown below.

[Compound 1] 301

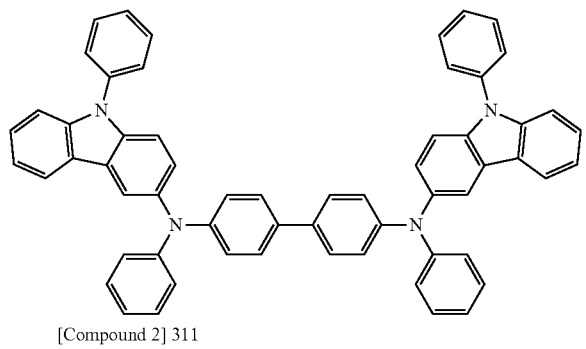

301

[Compound 2] 311

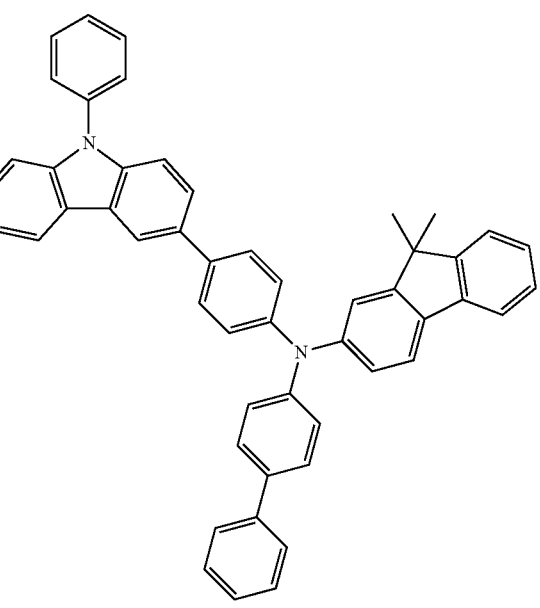

311

[Compound 3] 321

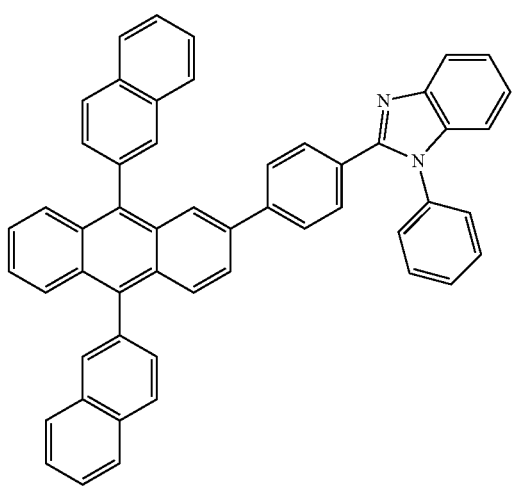

The second electrode 13c is formed on the intermediate layer 13b. The second electrode 13c may be a cathode electrode, which is an electron injection electrode, and may be formed of a second electrode material having a low work function. The second electrode material may be one selected from a metal, an alloy, an electroconductive compound, and a mixture of these materials. The second electrode 13c may be formed as a reflective electrode, a semi-transparent electrode, or a transmissive electrode by forming a thin film by using a material selected from Li, Mg, Al, Al—Li, Ca, Mg—In, and Mg—Ag. The second electrode 13c may be formed as a transmissive electrode by using ITO or IZO to obtain a top emission organic light-emitting display device, but the present embodiment is not limited thereto.

Although not shown in FIG. 1, the organic light-emitting unit 13 may include one pixel circuit per pixel and the pixel circuit may include at least one thin film transistor (TFT) and a capacitor. The TFT is connected electrically to and used for driving the first electrode 13a.

The first electrode 13a may be patterned to form each pixel, and the second electrode 13c may be formed as a common electrode to cover all the pixels.

In the case of a bottom emission organic light-emitting display device which displays an image in a direction towards the substrate 11, the second electrode 13c may be formed to have a relatively large thickness to increase light emitting efficiency towards the substrate 11.

In the case of a top emission organic light-emitting display device which displays an image in a direction towards the second electrode 13c, the second electrode 13c may be formed to have a relatively small thickness so that the second electrode 13c functions as a semi-transparent reflective film or may be formed of a transparent conductive material besides the materials described above. Also, in this case, the first electrode 13a may further include a reflective film.

Next, an organic film 14 is formed on the second electrode 13c. The organic film 14 performs as a protective layer for preventing the second electrode 13c from being damaged when a thin film encapsulating structure is formed on the organic light-emitting unit 13. Also, when the organic light-emitting unit 13 is a top emission organic light-emitting unit in which light is emitted towards the second electrode 13c, the organic film 14 is formed of a transparent material having a high refractive index to perform a reflective index matching function. The organic film 14 may be formed of at least one of, for example, LiF, 8-Hydroxyquinolinolato-lithium (Liq), and tris(8-hydroxy-quinolate)aluminum ($Alq_3$). The organic film 14 may be formed on the substrate 11 besides on an upper surface of the organic light-emitting unit 13. The organic film 14 may be formed as a uniform film to seal the entire organic light-emitting unit 13.

The organic film 14 may be formed by using a resistive heating evaporation method, a sputtering method, a vacuum evaporation method, a low temperature evaporation method, an electron beam coating method, or an ion plating method. In the resistive heating evaporation method, a source is evaporated by applying heat thereto in order to deposit the source on a body to be deposited. The heat is generated by flowing an electric current through a material with electrical resistance. The sputtering method is a method of forming a thin film by sputtering. The other methods are also known in the art, and thus, descriptions thereof will be omitted.

Next, as shown in FIGS. 2 and 3, a thin film encapsulating structure is formed on the organic light-emitting unit 13 that is covered by the organic film 14. The thin film encapsulating structure according to the current embodiment includes an elastic layer 15 and an inorganic film 17 stacked on the elastic layer 15.

Referring to FIG. 2, the elastic layer 15 is formed on the organic film 14. The elastic layer 15 is a film stress solving layer for reducing stress between the organic film 14 and the inorganic film 17 that is to be formed. The elastic layer 15 includes an elastomer. The elastomer includes an organic material and an inorganic material having elasticity. When the organic light-emitting display device is of a top emission organic light-emitting display device, the elastomer may be a transparent elastomer for light emission.

For example, the elastic layer 15 may include at least one material selected from a first group of poly dimethyl siloxane (PDMS), polysilicon, transparent poly-urethane, and styrene block copolymer (SBC). Besides those listed above, the elastic layer 15 may include at least one material selected from a second group of PET, PI, and polyvinyl chloride (PVC). The first group includes materials having elasticity greater than the materials included in the second group. The elastic layer 15 may be formed as a single layer or a multilayer including the materials described above.

The elastic layer 15 may be formed on the substrate 11 besides on an upper surface of the organic film 14. The elastic layer 15 may be formed as a uniform film to cover the entire organic light-emitting unit 13. In this way, the elastic layer 15 may further tightly seal the organic light-emitting unit 13 and the organic film 14.

The elastic layer 15 may be formed by using a resistive heating evaporation method, a sputtering method, a vacuum evaporation method, a low temperature evaporation method, an electron beam coating method, or an ion plating method.

Referring to FIG. 3, the inorganic film 17 is formed on the elastic layer 15. The inorganic film 17 includes a low temperature viscosity transition (LVT) inorganic material (hereinafter, an LVT inorganic material). Hereinafter, a method of forming the LVT inorganic material will be described in more detail.

First, a pre-inorganic layer that includes an LVT inorganic material is formed on the elastic layer 15 by providing the LVT inorganic material on the elastic layer 15.

The LVT inorganic material has a low temperature changing in viscosity.

In the current specification, the temperature changing in viscosity does not denote a temperature at which the viscosity of the LVT inorganic material changes from a 'solid' to a 'liquid', but denotes a minimum temperature at which the LVT inorganic material becomes fluid.

The temperature changing in viscosity of the LVT inorganic material may be lower than a transition temperature (e.g., a deformation temperature) of a material included in the organic light-emitting unit 13.

The deformation temperature of a material included in an organic light-emitting unit denotes a temperature at which a chemical and/or physical deformation of a material included in the organic light-emitting unit 13 is caused. For example, the deformation temperature of a material included in an organic light-emitting unit may denote a glass transition temperature Tg of an organic material included in the intermediate layer 13b of the organic light-emitting unit 13. The glass transition temperature Tg may be identified by performing a thermal analysis with respect to a material included in the organic light-emitting unit 13 by using thermo gravimetric analysis (TGA) and differential scanning calorimetry (DSC). The thermal analysis may be conducted under $N_2$ atmosphere, and using a temperature span of about room temperature to about 600° C. (at a heating rate of 10° C./min) for TGA, and from room temperature to 400° C. for DSC, and a Pt pan for TGA, and disposable Al pan for DSC. The thermal analysis process is known in the art, and thus, detailed descriptions thereof will be omitted.

The deformation temperature of a material included in the organic light-emitting unit 13 may exceed, for example, about 130° C., but is not limited thereto, and may be readily measured through the TGA analysis described above with respect to a material included in the organic light-emitting unit 13.

Here, the temperature changing in viscosity of the LVT inorganic material may be greater than about 80° C., in one embodiment, in a range from about 80° C. to about 130° C., but is not limited thereto. For example, the temperature changing in viscosity of the LVT inorganic material may be in a range from about 80° C. to about 120° C. or in a range from about 100° C. to about 120° C., but the temperature is not limited thereto.

The LVT inorganic material may consist of one compound or more than two compounds of different kinds.

The LVT inorganic material may include a tin oxide, for example, SnO or $SnO_2$.

When the LVT inorganic material includes SnO, the content of SnO may be in a range from about 20 wt % to about 100 wt %.

For example, the LVT inorganic material may further include one material selected from the group consisting of a phosphorus oxide, for example, $P_2O_5$, boron phosphate $BPO_4$, a tin fluoride, for example, $SnF_2$, a niobium oxide, for example, NbO, and a tungsten oxide, for example, $WO_3$, but the materials are not limited thereto. For example, the LVT inorganic material may include:

SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$;

The materials to be included in the LVT inorganic material are not limited to the above list.

For example, the LVT inorganic material may have a composition selected from the following group, but the composition is not limited thereto.

SnO (100 wt %);
SnO (80 wt %) and $P_2O_5$ (20 wt %);
SnO (90 wt %) and $BPO_4$ (10 wt %);
4) SnO (20-50 wt %), $SnF_2$ (30-60 wt %), and $P_2O_5$ (10-30 wt %) (where, a sum of weights of SnO, $SnF_2$ and $P_2O_5$ is 100 wt %);
5) SnO (20-50 wt %), $SnF_2$ (30-60 wt %), $P_2O_5$ (10-30 wt %), and NbO (1-5 wt %) (where, a sum of weight of SnO, $SnF_2$, $P_2O_5$, and NbO is 100 wt %); and
6) SnO (20-50 wt %), $SnF_2$ (30-60 wt %), $P_2O_5$ (10-30 wt %), and $WO_3$ (1-5 wt %) (where, a sum of weight of SnO, $SnF_2$, $P_2O_5$, and $WO_3$ is 100 wt %).

For example, the LVT inorganic material may include SnO (42.5 wt %), $SnF_2$ (40 wt %), $P_2O_5$ (15 wt %), and $WO_3$ (2.5 wt %), but the materials are not limited thereto.

The pre-inorganic layer may be formed by using a resistive heating evaporation method, a sputtering method, a vacuum evaporation method, a low temperature evaporation method, an electron beam coating method, or an ion plating method.

For example, the LVT inorganic material may be provided by using a plasma chemical vapor deposition (PECVD) method or a plasma ion assisted deposition (PIAD) method, but the methods are not limited thereto.

According to the current embodiment, an LVT inorganic material having a composition of SnO—$SnF_2$—$P_2O_5$—$WO_3$ may be provided on the elastic layer 15 through a sputtering method. The sputtering method may be a dual rotary target method or a facing target method using a DC pulse power source, and a scanning method may be used by moving the substrate 11. Argon plasma having a power in a range from about 4 kW to about 20 kW and a pressure in a range from about 0.3 Pa to about 1.5 Pa may be used. A pre-inorganic layer having a desired thickness (for example, approximately 1 μm) may be obtained by repeating the scanning several times.

The pre-inorganic layer formed in this way may include defects, such as film forming elements or pin holes. The film forming elements denote agglomerated particles of the LVT inorganic material that does not contribute to the film formation when the LVT inorganic material forms a film. The pin holes are regions where the elastic layer 15 is exposed in places where the LVT inorganic material is not provided.

The defects of the LVT inorganic material described above may be the paths for external materials, for example, moisture or oxygen, to enter when the organic light-emitting display device is operated or stored. Accordingly, the defects of the LVT inorganic material may be causes of dark spots developed progressively, and also, may be the cause of reduced lifetime of the organic light-emitting display device.

Accordingly, after forming the pre-inorganic layer, a healing process for removing the defects of the pre-inorganic layer may be performed.

The healing process may be performed at a temperature greater than a temperature changing in viscosity of the LVT inorganic material. For example, the healing process may be performed by heat treating the pre-inorganic layer at a temperature in a range from the temperature changing in viscosity of the LVT inorganic material or above, to less than the deformation temperature of a material included in the organic light-emitting unit 13. The temperature changing in viscosity of the LVT inorganic material may vary according to the composition of the LVT inorganic material, and the deformation temperature of a material included in the organic light-emitting unit 13 may vary according to the material of the organic light-emitting unit 13. However, the temperature changing in viscosity of the LVT inorganic material may be readily recognized by one of ordinary skill in the art according to the composition of the LVT inorganic material and the deformation temperature of the material included in the organic light-emitting unit 13 can be obtained (for example, by conducting Tg evaluation from a TGA result with respect to the material included in the organic light-emitting unit 13).

For example, the healing process may be performed by heat treating the pre-inorganic layer at a temperature in a range from about 80° C. to about 130° C. for a time period in a range from about one hour to about three hours (for example, a temperature of 110° C. for two hours), but the healing process is not limited thereto. When the temperature for the healing process is in the above range, fluidization of the LVT inorganic material of the pre-inorganic layer is possible and the deformation of the organic light-emitting unit 13 may be reduced or prevented.

The healing process may be performed in an infrared (IR) oven under a vacuum atmosphere or an inert gas atmosphere (for example, under an $N_2$ or Ar atmosphere) to prevent the organic light-emitting unit 13 from being exposed to an external atmosphere through the pin holes of the pre-inorganic layer.

In the healing process, the LVT inorganic material included in the pre-inorganic layer may be fluidized. The fluidized LVT inorganic material may have flowability. Accordingly, in the healing process, the fluidized LVT inorganic material may flow and fill the pin holes of the pre-inorganic layer, and film forming elements may also flow and fill in the pin holes.

As a result, a highly dense inorganic film 17 may be formed because the defects of the pre-inorganic layer are removed.

The inorganic film 17 may have a thickness in a range from about 1 μm to about 30 μm, for example, in a range from about 1 μm to about 5 μm. In one embodiment, when the thickness of the inorganic film 17 is in the range from about 1 μm to about 5 μm, a flexible organic light-emitting display device having a bending characteristic is realized. Also, because it is possible to form the inorganic film 17 as a thin film as described above, the realization of a flexible organic light-emitting display device having a bending characteristic is possible. In this way, an organic light-emitting display device having a long lifetime and flexible characteristic may be realized.

Figure 4:
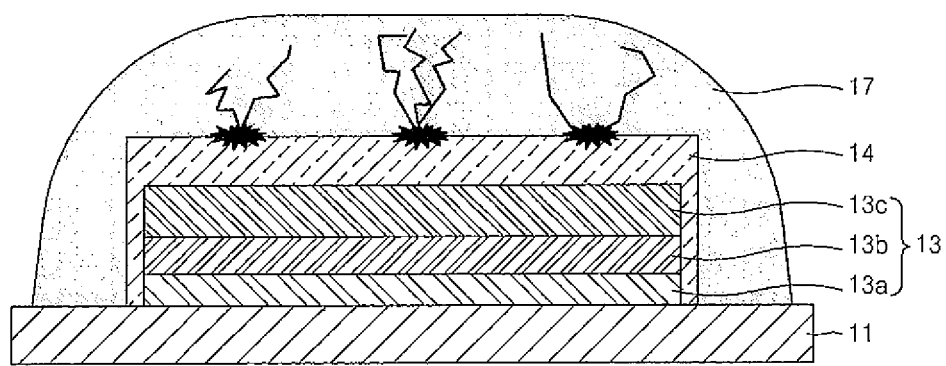
FIGS. 4 and 5 are schematic cross-sectional views for comparing an effect of an organic light-emitting display device according to an embodiment.
Figure 5:
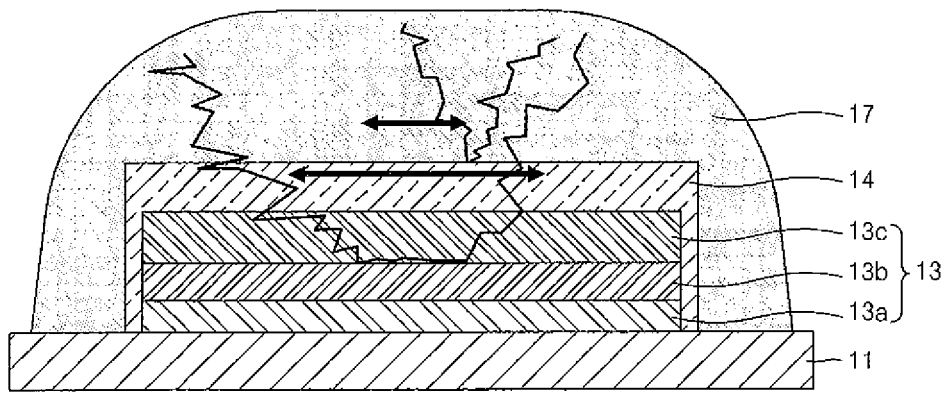

FIGS. 4 and 5 are schematic cross-sectional views for comparing an effect of an organic light-emitting display device according to an embodiment.

In FIGS. 4 and 5, a structure in which the inorganic film 17 is directly formed on the organic film 14, which is directly formed on the organic light-emitting unit 13, is shown. That is, FIGS. 4 and 5 show a structure in which a thin film encapsulation by using only the inorganic film 17 on the organic light-emitting unit 13 on which the organic film 14 is formed. In the case of a structure in which the inorganic film 17 contacts the organic film 14, an adhesive force between the inorganic film 17 and the organic film 14 is weak due to a material difference. Also, the inorganic film 17 and the organic film 14 have different thermal expansion coefficients. Accordingly, due to stress generated when the inorganic film 17 and the organic film 14 expand with different degrees from each other due to heat generated from the organic light-emitting unit 13 and a surrounding temperature change, as depicted in FIG. 4, interfacial delamination may occur at an interface between the inorganic film 17 and the organic film 14 or a defect such as cracks may occur in the inorganic film 17 that has a dense film quality. As a result, as depicted in FIG. 5, the organic light-emitting display device may be degraded by moisture or oxygen penetrated into the organic light-emitting unit 13. Therefore, a light emission characteristic of the organic light-emitting display device may be reduced and dark spots and pixel shrinkage may occur in the organic light-emitting display device.

However, according to the current embodiment, as depicted in FIG. 3, the above problems may be solved by including the elastic layer 15 between the organic film 14 and the inorganic film 17. Because the elastic layer 15 is formed of an elastic material, stress, which is the main cause of defects of the inorganic film 17, between the organic film 14 and the inorganic film 17 may be reduced.

Figure 6:
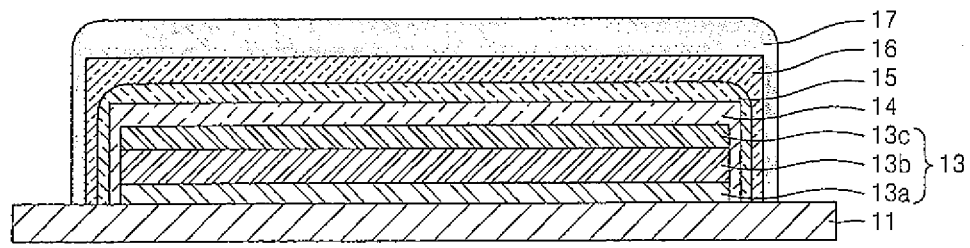
FIG. 6 is a schematic cross-sectional view illustrating an organic light-emitting display device according to another embodiment.

FIG. 6 is a schematic cross-sectional view illustrating an organic light-emitting display device according to another embodiment.

An aspect of the organic light-emitting display device depicted in FIG. 6 is that an adhesion promoting layer 16 is further formed between the elastic layer 15 and the inorganic film 17 when compared to the organic light-emitting display device depicted in FIG. 3. Constituent elements in the organic light-emitting display device of FIG. 6 perform substantially the same functions as or similar functions to the corresponding constituent elements in the organic light-emitting display device of FIG. 3, and thus, the descriptions thereof will be omitted.

The adhesion promoting layer 16 promotes adhesion between the elastic layer 15 and the inorganic film 17. For example, when the elastic layer 15 includes an organic material, the elastic layer 15 forms an organic-inorganic interface with the inorganic film 17. Therefore, although the organic material has elasticity, the adhesion force between the elastic layer 15 and the inorganic film 17 may be weaker than the adhesion force at an inorganic-inorganic interface. Accordingly, a further sound thin film encapsulating structure that increases the adhesion force between the elastic layer 15 and the inorganic film 17 may be realized by disposing the adhesion promoting layer 16 between the elastic layer 15 and the inorganic film 17. The adhesion promoting layer 16 may include at least one of a metal oxide and an organometallic compound. The adhesion promoting layer 16 may be formed as a single layer or a multilayer including the materials described above.

The adhesion promoting layer 16 may be formed on the substrate 11 besides on an upper surface of the elastic layer 15. The adhesion promoting layer 16 may be formed as a uniform film to cover the entire organic light-emitting unit 13. In this way, the adhesion promoting layer 16 may further tightly seal the organic light-emitting unit 13 and the organic film 14.

The adhesion promoting layer 16 may be formed by using a resistive heating evaporation method, a sputtering method, a vacuum evaporation method, a low temperature evaporation method, an electron beam coating method, or an ion plating method.

Figure 7:
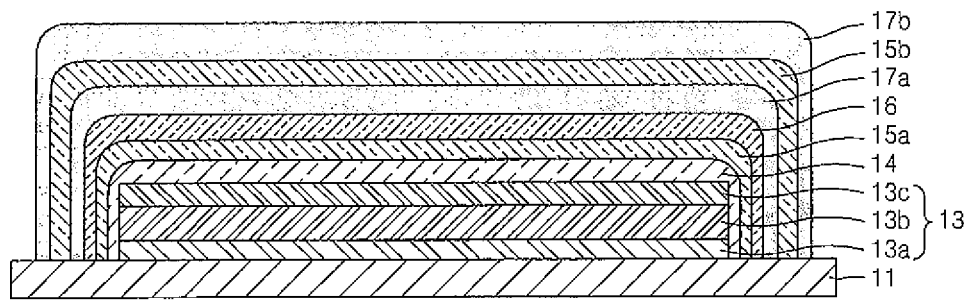
FIG. 7 is a schematic cross-sectional view illustrating an organic light-emitting display device according to another embodiment.

FIG. 7 is a schematic cross-sectional view illustrating an organic light-emitting display device according to another embodiment.

In the organic light-emitting display device of FIG. 7, a second elastic layer 15b and a second inorganic film 17b are further sequentially formed on a first inorganic film 17a in comparison with the organic light-emitting display device of FIG. 6. Constituent elements in the organic light-emitting display device of FIG. 7 perform substantially the same functions as or similar functions to the corresponding constituent elements in the organic light-emitting display device of FIG. 6, and thus, the descriptions thereof will be omitted.

Generally, a film stress is proportional to a film thickness. Accordingly, in order to reduce a film stress, the inorganic film 17 is deposited by dividing it into the first inorganic film 17a and the second inorganic film 17b. Also, in order to reduce a film stress between the first inorganic film 17a and the second inorganic film 17b, the second elastic layer 15b is formed therebetween. In this case, the elastic layer 15 formed on the organic film 14 is referred to as a first elastic layer 15a.

More specifically, the second elastic layer 15b is formed on the first inorganic film 17a which is the inorganic film 17 of FIG. 6. The method of forming the second elastic layer 15b, materials that constitute the second elastic layer 15b, and the type of the second elastic layer 15b are substantially the same as in the case of the elastic layer 15 described with reference to FIGS. 1 through 3, and thus, the descriptions thereof will not be repeated.

Next, the second inorganic film 17b is formed on the second elastic layer 15b. The method of forming the second inorganic film 17b, materials that constitute the second inorganic film 17b, and the type of the second inorganic film 17b are substantially the same as in the case of the inorganic film 17 described with reference to FIGS. 1 through 3, and thus, the descriptions thereof will not be repeated.

According to an aspect of the present embodiment, the first and second inorganic films 17a and 17b have a thickness smaller than that of the inorganic film 17 described in FIGS. 3 and 6. The inorganic film 17 of FIGS. 3 and 6 may have a thickness in a range from about 1 μm to about 30 μm, for example, in a range from about 1 μm to about 5 μm. However, the first inorganic film 17a of FIG. 7 may have a thickness of about 1 μm or less, and also, the second inorganic film 17b may have a thickness of about 1 μm or less. That is, in the previous embodiment, the inorganic film 17 is formed to have a thickness in a range from about 1 μm to about 5 μm. However, in the current embodiment, a plurality of inorganic films each having a thickness of about 1 μm or less is formed. In this way, a film stress may be reduced and the sealing quality of the thin film encapsulating structure may be improved.

In FIG. 7, it is depicted that the inorganic films are formed twice. However, this is just an example, and the inorganic films may be formed more than three times, and also, in this case, elastic layers may be formed between the inorganic films in order to reduce stress between the inorganic films.

Also, in FIG. 7, an elastic layer is formed between the inorganic films. However, it is an example, that is, as depicted in FIG. 6, an adhesion promoting layer may further be formed between the elastic layer and the inorganic film.

Figure 8:
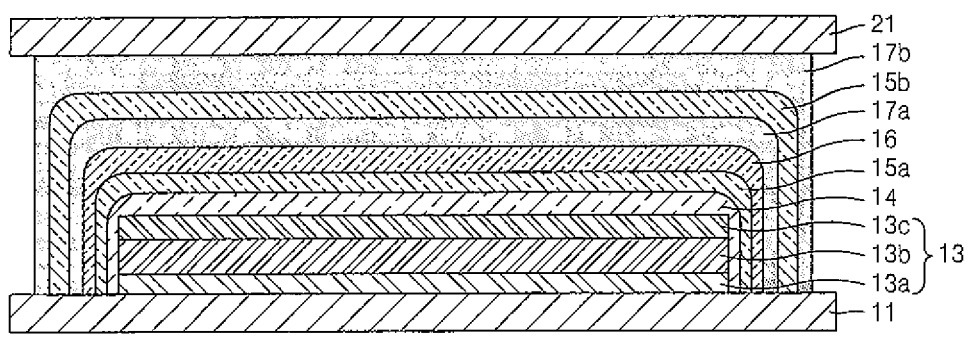
FIG. 8 is a schematic cross-sectional view illustrating an organic light-emitting display device according to yet another embodiment.

FIG. 8 is a schematic cross-sectional view illustrating an organic light-emitting display device according to yet another embodiment of the present embodiment.

In the organic light-emitting display device of FIG. 8, an encapsulation substrate 21 is further formed on an outermost inorganic film 17b when compared to the organic light-emitting display device of FIG. 7. Constituent elements in the organic light-emitting display device of FIG. 8 perform substantially the same functions as or similar functions to the corresponding constituent elements in the organic light-emitting display device of FIG. 7, and thus, the descriptions thereof will be omitted.

The encapsulation substrate 21 is disposed on an outermost side of the thin film encapsulating structure to further reinforcing the sealing structure, and thus, protecting the organic light-emitting display device from an external impact. The encapsulation substrate 21 may be formed of the same material as the substrate 11. When the organic light-emitting display device is a top emission organic light-emitting display device in which light is emitted towards the second electrode 13c, the encapsulation substrate 21 may be formed as a transparent substrate to transmit light.

In an aspect of the present embodiment, the encapsulation substrate 21 is disposed on an outermost inorganic film. In FIG. 8, the encapsulation substrate 21 is disposed on the second inorganic film 17b of the thin film encapsulating structure of FIG. 7, as an example.

The embodiments of the present embodiment include a structure in which an encapsulation substrate is formed on an upper side of the inorganic film in the thin film encapsulating structure of FIG. 3; a structure in which an encapsulation substrate is formed on an upper side of the inorganic film in the thin film encapsulating structure of FIG. 6; and a structure in which an encapsulation substrate is formed on an upper side of the second inorganic film in the thin film encapsulating structure of FIG. 7 and an adhesion promoting layer is further formed between the second elastic layer and the second inorganic film. Also, the encapsulation substrate may further be formed on an outermost inorganic film of a thin film encapsulating structure formed by combining the embodiments.

While aspects of the present invention have been particularly shown and described with reference to some example embodiments thereof, it will be understood by those of ordinary skill in the art that various changes in form and details may be made therein without departing from the spirit and scope of the present embodiment as defined by the following claims, and equivalents thereof.

What is claimed is:

1. An organic light-emitting display device comprising:
   a substrate;
   an organic light-emitting unit on the substrate and comprising a first electrode, an intermediate layer, and a second electrode;
   an organic film on the organic light-emitting unit;
   a first elastic layer comprising an elastomer on the organic film; and
   a first inorganic film comprising a low temperature viscosity transition (LVT) inorganic material on the first elastic layer,
   wherein the organic film and the first elastic layer are formed of different materials, and
   the organic film is between the organic light-emitting unit and the first elastic layer.

2. The organic light-emitting display device of claim 1, wherein the elastomer is a transparent elastomer.

3. The organic light-emitting display device of claim 1, wherein the elastomer comprises at least one selected from the group consisting of poly dimethyl siloxane (PDMS), polysilicon, transparent poly-urethane, and styrene block copolymer (SBC).

4. The organic light-emitting display device of claim 1, wherein the LVT inorganic material comprises a tin oxide.

5. The organic light-emitting display device of claim 1, wherein the first elastic layer and the first inorganic film are formed on the substrate.

6. The organic light-emitting display device of claim 1, further comprising an adhesion promoting layer between the first elastic layer and the first inorganic film.

7. The organic light-emitting display device of claim 6, wherein the adhesion promoting layer comprises at least one selected from the group consisting of a metal oxide and an organometallic compound.

8. The organic light-emitting display device of claim 1, further comprising:
   a second elastic layer comprising the elastomer on the first inorganic film ; and
   a second inorganic film comprising the LVT inorganic material on the second elastic layer.

9. The organic light-emitting display device of claim 8, further comprising an encapsulation substrate on the second inorganic film.

10. The organic light-emitting display device of claim 1, wherein the organic film comprises at least one selected from the group consisting of LiF, 8-Hydroxyquinolinolato-lithium (Liq) and tris(8-hydroxy-quinolate)aluminum ($Alq_3$).

* * * * *